(12) United States Patent
Chou et al.

(10) Patent No.: US 12,431,201 B2
(45) Date of Patent: Sep. 30, 2025

(54) MEMORY DEVICE AND AN OPERATION METHOD THEREOF

(71) Applicant: MACRONIX INTERNATIONAL CO., LTD., Hsinchu (TW)

(72) Inventors: You-Liang Chou, Taichung (TW); Wen-Jer Tsai, Hualien (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 163 days.

(21) Appl. No.: 18/449,725

(22) Filed: Aug. 15, 2023

(65) Prior Publication Data
US 2024/0379171 A1 Nov. 14, 2024

Related U.S. Application Data

(60) Provisional application No. 63/464,953, filed on May 9, 2023.

(51) Int. Cl.
*G11C 16/28* (2006.01)
*G11C 11/56* (2006.01)
(Continued)

(52) U.S. Cl.
CPC .......... *G11C 16/34* (2013.01); *G11C 11/5621* (2013.01); *G11C 11/5671* (2013.01);
(Continued)

(58) Field of Classification Search
CPC ... G11C 16/26; G11C 16/0483; G11C 16/102; G11C 16/28; G11C 16/34; G11C 11/54;
(Continued)

(56) References Cited

U.S. PATENT DOCUMENTS 8,040,723 B2 10/2011 Sheu
9,679,664 B2 6/2017 Ong
(Continued)

FOREIGN PATENT DOCUMENTS

TW 201118876 A 6/2011
TW 202242883 A 11/2022

OTHER PUBLICATIONS

Back, et al.: "String Current Compensation Method in VNAND Flash for Hardware-Based BNNs"; IEEE Transactions on Electron Devices, vol. 69, No. 12, Dec. 2022; pp. 6717-6721.
(Continued)

*Primary Examiner* — Jay W. Radke
(74) *Attorney, Agent, or Firm* — McClure, Qualey & Rodack, LLP

(57) ABSTRACT

A memory device is provided and includes a memory array. The memory array includes multiple strings, each of the strings including multiple memory cells and at least one compensation cell that are coupled in series to a corresponding one of multiple bit lines. In a read operation, the at least one compensation cell in each of the strings has a resistance responsive to at least one compensation voltage applied on the at least one compensation cell to adjust a read current in the corresponding bit line to a current value. The resistance is associated with a number of programmed cells in the memory cells coupled to the corresponding bit line.

19 Claims, 10 Drawing Sheets

400

PERFORMING A FIRST PROGRAMMING OPERATION TO WRITE DATA CORRESPONDING TO A NEURAL NETWORK TO A MEMORY ARRAY, WHEREIN THE MEMORY ARRAY INCLUDES MULTIPLE MEMORY CELLS IN A FIRST SUB-ARRAY AND MULTIPLE COMPENSATION CELLS IN A SECOND SUB-ARRAY THAT ARE ARRANGED IN MULTIPLE STRINGS — 401

PERFORMING A FIRST READ OPERATION TO MULTIPLE REFERENCE CELLS THAT ARE SELECTED TO OBTAIN MULTIPLE READ CURRENTS IN MULTIPLE BIT LINES, WHEREIN EACH OF THE REFERENCE CELLS IS FURTHER COUPLED TO A CORRESPONDING STRING OF THE STRINGS THROUGH A CORRESPONDING ONE IN MULTIPLE BIT LINES — 402

COMPENSATING THE READ CURRENTS TO A TARGET CURRENT VALUE BY ADJUSTING A VOLTAGE DIFFERENCE BETWEEN AT LEAST ONE COMPENSATION VOLTAGE APPLIED ON THE COMPENSATION CELLS AND THRESHOLD VOLTAGES OF THE COMPENSATION CELLS IN A SECOND READ OPERATION — 403

(51) Int. Cl.
*G11C 16/04* (2006.01)
*G11C 16/34* (2006.01)
*G11C 11/54* (2006.01)

(52) U.S. Cl.
CPC .......... *G11C 16/0483* (2013.01); *G11C 16/28* (2013.01); *G11C 11/54* (2013.01)

(58) Field of Classification Search
CPC ... G11C 7/02; G11C 11/5628; G11C 11/5642; G11C 16/24; G11C 16/30
See application file for complete search history.

(56) References Cited

U.S. PATENT DOCUMENTS

2010/0085799 A1   4/2010  Cho
2024/0046080 A1*  2/2024  Lee .................... G11C 11/5628

OTHER PUBLICATIONS

Yoo, et al.: "First Demonstration of 1-bit Erase in Vertical NAND Flash Memory"; 2022 Symposium on VLSI Technology & Circuits Digest of Technical Papers; pp. 304-305.

* cited by examiner

MEMORY DEVICE AND AN OPERATION METHOD THEREOF

RELATED APPLICATIONS

This application claims the benefit of U.S. Provisional Patent Application No. 63/464,953, filed on 9 May 2023, which application is incorporated by reference as if fully set forth herein.

BACKGROUND

Technical Field

The present application relates to a memory device and an operation method thereof. More particularly, the present application relates to a memory device having compensation cells and an operation method thereof.

Description of Related Art

In the design of 3D NAND flash memory circuits, which use different types of memory cells like floating gate transistors or semiconductor-oxide-nitride-oxide-semiconductor (SONOS) transistors, there is a concern regarding the accuracy of the current in these cells and its impact on computation accuracy. This becomes especially important during multiply-and-accumulation (MAC) operations, where string resistance can cause a decline in accuracy for tasks like inference and classification.

To mitigate the problem of string resistance, one approach is to reduce the resistance of unselected cells. This can be done by increasing the overdrive voltage (Vpass-Vth) of those cells. However, this approach presents a challenge: the higher overdrive voltage can lead to changes in the threshold voltage (Vth) of unselected cells during read operations, resulting in what is known as read disturb.

In various approaches, compensation cells are utilized to address the drop in on-state current caused by programmed cells within the cell string. The idea is to program an equal number of compensation cells as there are erased synaptic cells, ensuring a consistent count of programmed unselected cells in each string. As the network becomes more complex, the number of corresponding compensation cells also increases. It requires adding more cells to a string to accommodate compensation, necessitating additional vertically stacked layers of memory cells in the 3D NAND structure. Moreover, variations in the critical dimensions of the channel holes between word lines can introduce imbalances in the compensation process.

SUMMARY

A memory device is provided and includes a memory array. The memory array includes multiple strings, each of the strings including multiple memory cells and at least one compensation cell that are coupled in series to a corresponding one of multiple bit lines. In a read operation, the at least one compensation cell in each of the strings has a resistance responsive to at least one compensation voltage applied on the at least one compensation cell to adjust a read current in the corresponding bit line to a current value. The resistance is associated with a number of programmed cells in the memory cells coupled to the corresponding bit line.

In some embodiments, the resistance of at least one compensation cell is inversely proportional to the number of the programmed cells in the memory cells coupled to the corresponding bit line.

In some embodiments, when the number of the programmed cells in a first string of the strings is greater than the number of the programmed cells in a second string of the strings, the resistance of the at least one compensation cell in the first string is smaller than the resistance of the at least one compensation cell in the second string.

In some embodiments, unselected memory cells in the memory cells receive a read pass voltage through multiple word lines in the read operation. The at least one compensation voltage is smaller than the read pass voltage.

In some embodiments, the at least one compensation cell includes multiple compensation cells in multiple pages in a corresponding string.

In some embodiments, the at least one compensation voltage includes multiple compensation voltages each applied to a corresponding one of the compensation cells.

In some embodiments, threshold voltages of the multiple compensation cells are different from each other.

In some embodiments, the compensation cells are separated by the memory cells.

In some embodiments, the at least one compensation cell in each of the strings is configured to be programmed to have a threshold voltage according to the number of the programmed cells in a corresponding string in the strings.

An operation method of a memory device is provided, including performing a first programming operation to write data corresponding to a neural network to a memory array, wherein the memory array includes multiple memory cells in a first sub-array and multiple compensation cells in a second sub-array that are arranged in multiple strings; performing a first read operation to multiple reference cells that are selected to obtain multiple read currents in multiple bit lines, wherein each of the reference cells is coupled to a corresponding string of the strings through a corresponding one the bit lines; and compensating the read currents to a target current value by adjusting a voltage difference between at least one compensation voltage applied on the compensation cells and threshold voltages of the compensation cells in a second read operation.

In some embodiments, the compensation cells are coupled to a same word line. Compensating the read currents includes applying the at least one compensation voltage having a first voltage value when a first read current of the read currents differs from the target current value by a first value; and applying the at least one compensation voltage having a second voltage value when a second read current of the read currents differs from the target current value by a second value. The first value is greater than the second value, and the first voltage value is smaller than the second voltage value.

In some embodiments, a number of programmed cells in a first string, corresponding to the first read current, of the strings is smaller than a number of programmed cells in a second string, corresponding to the second read current, of the strings.

In some embodiments, compensating the read currents includes performing a second programming operation to adjust the threshold voltages of the compensation cells in the strings according to a number of programmed cells in the memory cells of the strings.

In some embodiments, the compensation cells are arranged in multiple pages in the second sub-array. Compensating the read currents includes performing a second programming operation to adjust the threshold voltages of the compensation cells in one page of the pages to be greater than the threshold voltages of the compensation cells in remaining pages of the pages.

In some embodiments, first and second portions of the second sub-array are on opposite sides of the first sub-array.

In some embodiments, the reference cells are erased.

A memory device is provided, including a memory array including multiple strings including multiple memory cells and multiple compensation cells that are coupled in series through multiple bit lines. In a read operation, the compensation cell in the strings are configured to transmit, in response to multiple first word line signals, multiple read currents that have a same current value. A number of programmed cells in the memory cells in a first string of the strings is different from a number of programmed cells in the memory cells in a second string of the strings.

In some embodiments, voltage values of the first word line signals are different from each other and smaller than voltage values of multiple second word line signals transmitted to unselected memory cells in the memory cells.

In some embodiments, resistances of the compensation cells in different strings of the strings are different.

In some embodiments, threshold voltages of multiple the compensation cells are different from each other.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
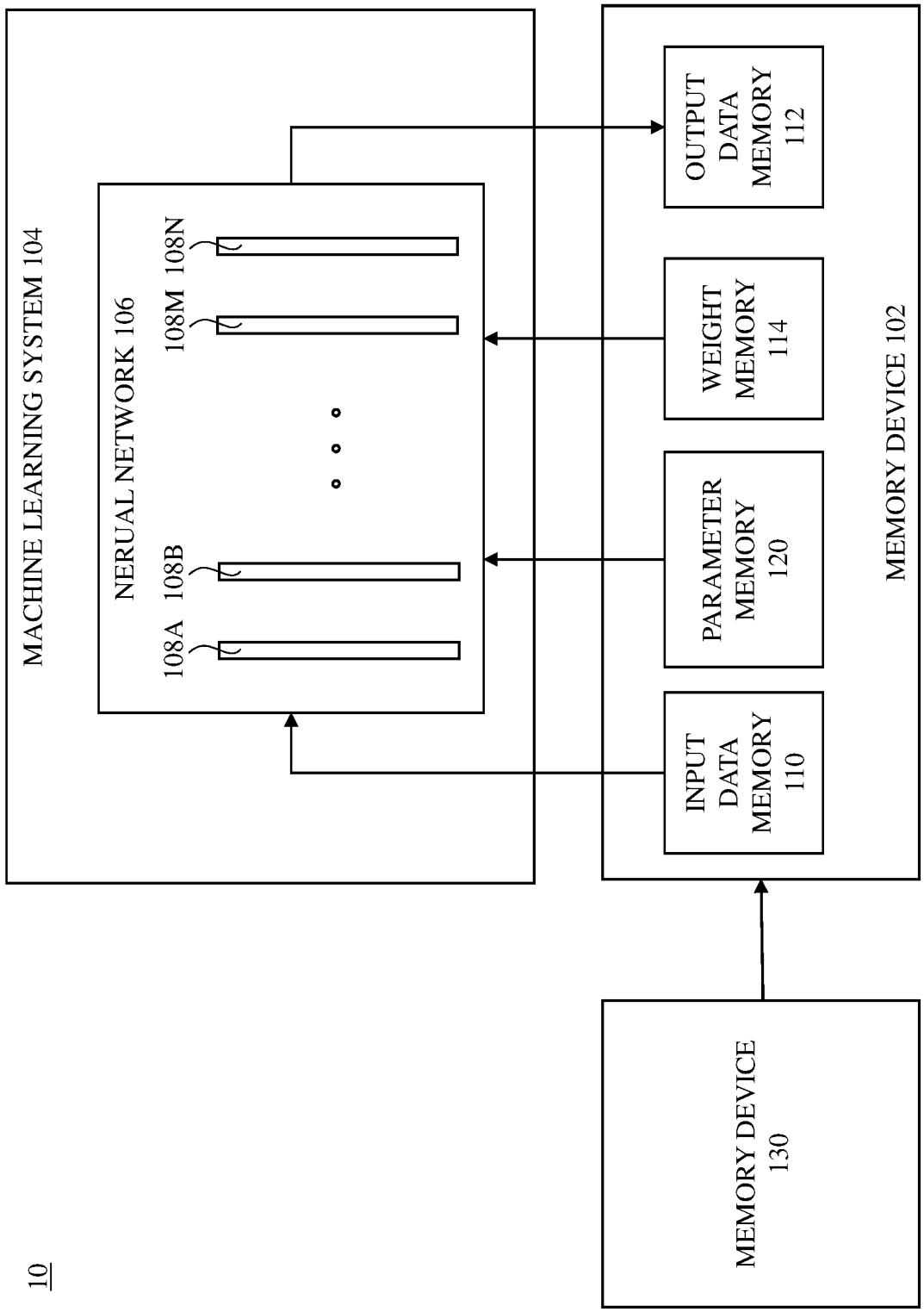
FIG. 1 illustrates a schematic diagram of a computing system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 illustrates a schematic diagram of a computing system 10, in accordance with some embodiments. As shown in FIG. 1, the computing system 10 includes processing circuitry for executing a machine learning system 104 having a neural network 106 including multiple layers 108A through 108N (collectively, "layers 108"). The neural network 106 may include various types of deep neural networks (DNNs), such as binary neural networks (BNNs), hardware-based quantized neural network (QNN) and convolutional neural networks (CNNs). In some embodiments, the processing circuitry of the computing system 10 includes one or more of a microprocessor, a controller, a digital signal processor (DSP), an application specific integrated circuit (ASIC), a field-programmable gate array (FPGA), or equivalent discrete or integrated logic circuitry, or other types of processing circuitry.

In some embodiments, the computing system 10 is implemented in circuitry, such as via one or more processors and a memory device 102. The memory device 102 includes one or more storage devices (memory). One or more components of computing system 10 (e.g., the processors, the memory device 102, etc.) may be interconnected to enable inter-component communications (physically, communicatively, and/or operatively). The one or more processors of computing system 10 may implement functionality and/or execute instructions associated with the computing system 10.

The memory device 102 may store information for processing during operation of the computing system 10. In some embodiments, the memory device 102 includes temporary memories, meaning that a primary purpose of the one or more storage devices of memory device 102 is not long-term storage. The memory device 102 may be configured for short-term storage of information as volatile memory and therefore not retain stored contents if deactivated. Examples of volatile memories include random access memories (RAM), dynamic random access memories (DRAM), static random access memories (SRAM), and other forms of volatile memories known in the art. In some embodiments, the memory device 102, also include one or more computer-readable storage media. The memory device 102 may be configured to store larger amounts of information than volatile memory. The memory device 102 may further be configured for long-term storage of information as non-volatile memory and retain information after activate/off cycles. The memory device 102 may store program instructions and/or data associated with one or more of the modules described in accordance with one or more aspects of this disclosure.

In the embodiments of FIG. 1, the neural network 106 receives input data from an input data memory 110 and generates output data to an output data memory 112. The input data memory 110 and the output data memory 112 may contain various types of information. For example, the input data memory 110 may store image data, video data, audio data, source text data, numerical data, speech data, and so on. The output data memory 112 may store classification data, translated text data, image classification data, robotic control data, transcription data, and so on. Furthermore, as described elsewhere in this disclosure, the output data memory 112 may store neural network software architecture and a mapping of neural networks in the neural network software architecture to processors of a hardware architecture.

As mentioned above, the neural network 106 has multiple layers 108. Each of layers 108 may include a respective set of artificial neurons. The layers 108 include an input layer 108A, an output layer 108N, and one or more hidden layers (e.g., layers 108B through 108M). The layers 108 may include fully connected layers, convolutional layers, pooling layers, and/or other types of layers. In a fully connected layer, the output of each neuron of a previous layer forms an input of each neuron of the fully connected layer. In a convolutional layer, each neuron of the convolutional layer processes input from neurons associated with the neuron's receptive field. Pooling layers combine the outputs of neuron clusters at one layer into a single neuron in the next layer.

Each input of each artificial neuron in each of the layers 108 is associated with a corresponding weight value in a weight memory 114. In accordance with a technique of this disclosure, the memory device 102 stores a set of weight values in the weight memory 114 for the neural network 106 and parameter values in a parameter memory 120 for operating the neural network 106.

A machine learning system 104 performs a feed-forward phase and a back propagation method that calculates a gradient of a loss function. The loss function produces a cost value based on the output data. In accordance with a technique of this disclosure, the machine learning system 104 may then update the parameters in the parameter memory 120 based on the gradient of the loss function.

In some embodiments, as shown in FIG. 1, the computing system 10 further includes a memory device 130 transmitting data being utilized for the neural network 106 to the memory device 102. In some embodiments, the memory device 130 is referred to as an off-chip memory device.

Figure 2:
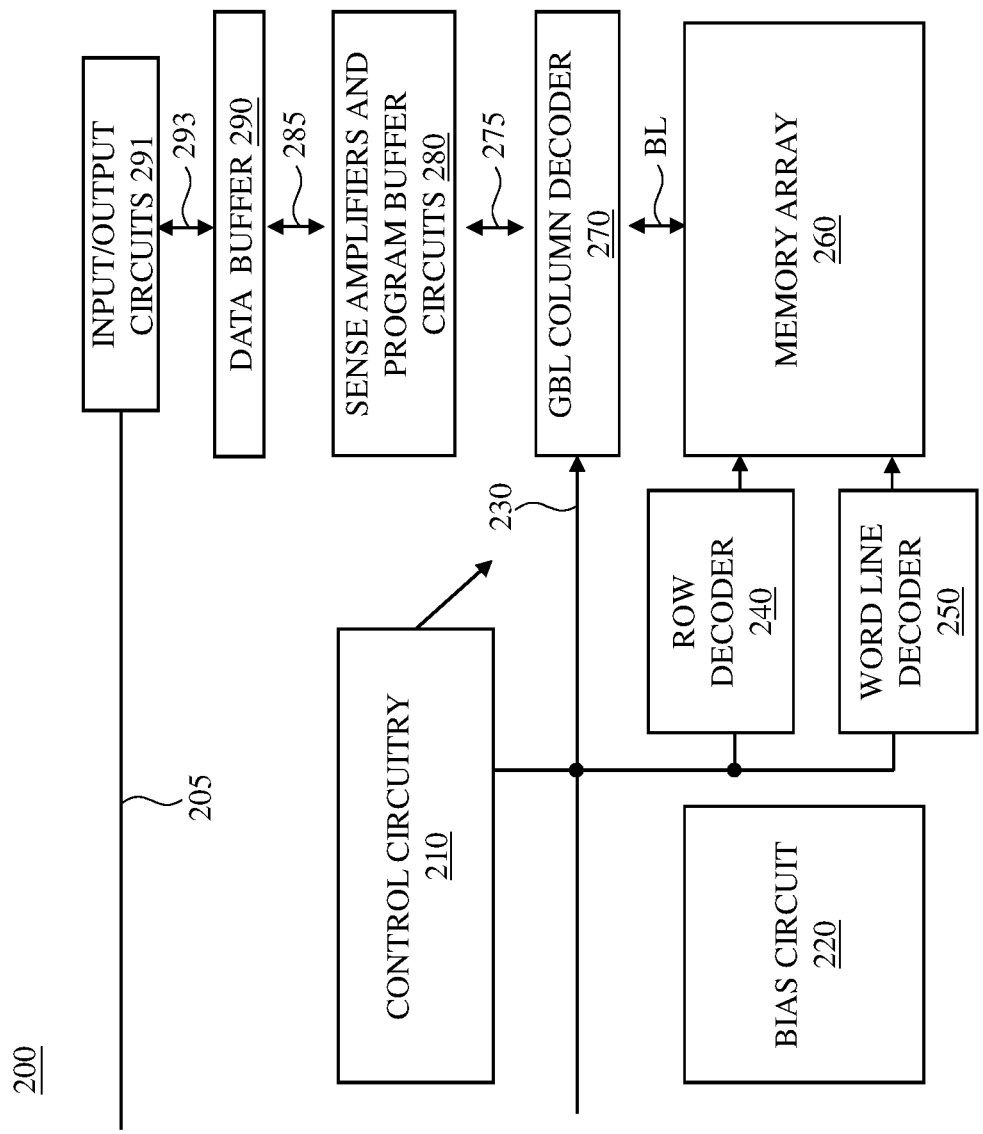
FIG. 2 illustrates a schematic diagram of a memory device, in accordance with some embodiments.

Reference is now made to FIG. 2. FIG. 2 illustrates a schematic diagram of a memory device 200 corresponding to the memory device 102 of FIG. 1, in accordance with some embodiments. For illustrations, the memory device 200 includes a memory array 260 including one or more memory blocks having strings of memory cells. In some embodiments, the memory array 260 includes a 3D vertical thin-channel film NAND array configured with respect to the weight memory 114 of FIG. 1 to store weight data for the neural network 106. With reference to FIGS. 1-2 together, the memory device 200 receives the weight data through the data bus 205 to an input/output circuit 291 of the memory device 200 and elements in the memory device 200 cooperate to write the weight data into the memory array 260.

A row decoder 240 is coupled to multiple string select lines (SSL) to select a string of memory cells in one of blocks of memory cells in the memory array 260 and is coupled to global select lines. A word line decoder 250 is coupled to word lines in the memory array 260. A global bit line (GBL) column decoder 270 is coupled to bit lines BL arranged along columns in the memory array 260 for reading data from and writing data to the memory array 260. Addresses are supplied on bus 230 from a control circuitry 210 to the global bit line column decoder 270, the row decoder 240 and the word line decoder 250. Sense amplifiers and program buffer circuits 280 are coupled to the global bit line column decoder 270, via data lines 275. The program buffer circuits 280 can store program codes for multiple-level programming, or values that are a function of the program codes, to indicate program or inhibit states for selected bit lines. The global bit line column decoder 270 can include circuits for selectively applying program and inhibit voltages to bit lines in the memory in response to the data values in the program buffer.

Sensed data from the sense amplifier/program buffer circuits 280 are supplied via data lines 285 to a data buffer 290, which is in turn coupled to the input/output circuits 291 via a data path 293.

The Input/output circuits 291 drive the data to the neural network 106, in some embodiments. The input/output data and control signals are moved via the data bus 205 between the input/output circuits 291. A control circuitry 210 and input/output ports on the memory device 200 or other data sources internal or external to the memory device 200, such as a general purpose processor or special purpose application circuitry, or a combination of modules provide system-on-a-chip functionality supported by the memory array 260.

In the embodiments shown in FIG. 2, the control circuitry 210 is coupled to the string select lines, the data buffer 290, the word line decoder 250, and the memory array 260. The control circuitry 210, using a bias arrangement state machine, controls the application of supply voltages generated or provided through the voltage supply or supplies in the sense amplifier/program buffer circuits 280 such as read, erase, verify and program bias voltages. The control circuitry 210 can be implemented using special-purpose logic circuitry as known in the art. In alternative embodiments, the control logic includes a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The memory array 260 can include charge trapping memory cells configured to store multiple bits per cell, by the establishment of multiple program levels that correspond to amounts of charge stored, which in turn establish memory cell threshold voltages.

Figure 3:
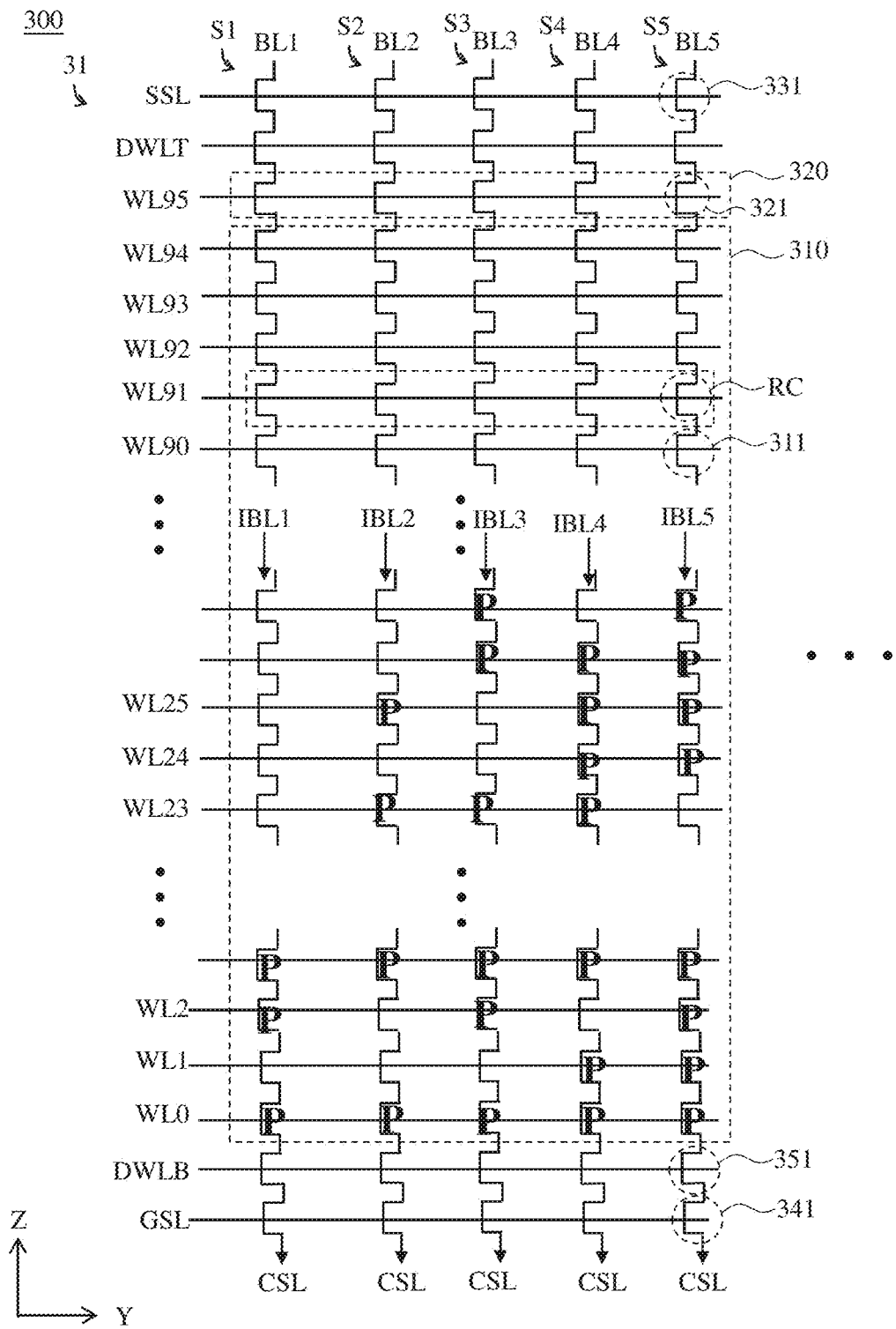
FIG. 3 illustrates a schematic diagram of part of the memory array corresponding to a memory array in FIG. 2, in accordance with some embodiments.

Reference is now made to FIG. 3. FIG. 3 illustrates a schematic diagram of part of a memory array 300 corresponding to the memory array 260 in FIG. 2, in accordance with some embodiments. As shown in FIG. 3, a block of the memory array 300 includes strings S1-S5 of cells arranged in a YZ plane and in sequence along y direction. For illustration, each of the strings S1-S5 includes memory cells 311 in a sub-array 310 and at least one compensation cell 321 in a sub-array 320 that are coupled in series to a corresponding one of bit lines BL1-BL5. For illustration, the memory cells 311 coupled to word lines, for example, WL0-WL94 and the compensation cells 321 coupled to word line, for example, WL95, to form multiple pages 31. The word lines WL0-WL95 are coupled to the word line decoder 250 of FIG. 2 to receive word line signals for operations. One of pages 31 can be a layer (e.g., a conductive layer or a word line layer) in XY plane, and the memory cells 311 on the same layer or the compensation cells 321 on the same layer can be coupled to a same word line and receive a same applied voltage. In some embodiments, weight values corresponding to a layer of the neural network 106 are stored in the same page in the memory array 300.

The strings S1-S5 further includes cells 331 configured as string select transistors coupled to the string select line SSL on a page above the pages 31 and cells 341 configured as ground select transistor coupled to the ground select line GSL on a page below the pages 31. The strings S1-S5 are connect to a common source line CSL. In some embodiments, the common source line CSL can be a conductive layer (or multiple conductive lines) formed on a substrate of a 3D memory chip and can be coupled to the ground.

As shown in FIG. 3, dummy lines DWLT and DWLB are disposed between the string select line SSL and the most upper word line WL95 or between the ground select line GSL and the most lower word line WL0. The configurations of FIG. 3 are given for illustrative purposes. Various implements are within the contemplated scope of the present disclosure. For example, in some embodiments, the memory array 300 does not include the configurations of the dummy lines DWLT and DWLB.

Figure 4:
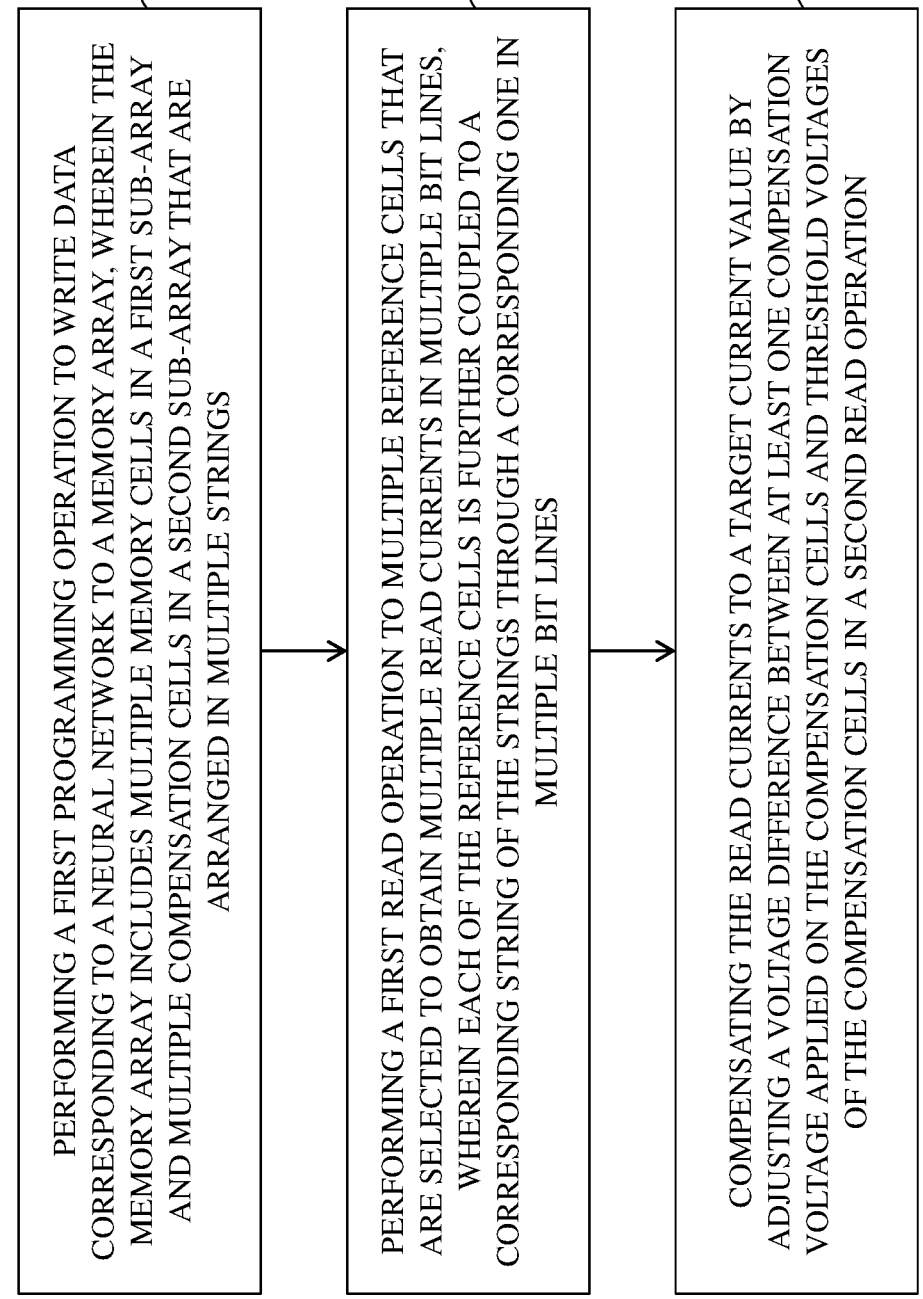
FIG. 4 illustrates a flow chart of an operation method of a memory device corresponding to FIGS. 1-3, in accordance with some embodiments.

Reference is now made to FIG. 4. FIG. 4 illustrates a flow chart of an operation method 400 of the memory device 200 corresponding to FIGS. 1-3, in accordance with some embodiments. It is understood that additional operations can be provided before, during, and after the processes shown by FIG. 4, and some of the operations described below can be replaced or eliminated, for additional embodiments of the operation method 400. The operation method 400 includes operations 401-403 that are described below with reference to FIGS. 2-10.

In operation 401, a programming operation is performed to write data, for example, weight values that correspond to the neural network 106 and are stored in the program buffer 280, to the memory array 300.

As shown in FIG. 3, in the programming operation, the strings S1-S5 are selected by biasing the bit lines BL1-BL5 in sequence along Y direction. For example, to program the memory cells 311, marked with "P," in the string S1 to be written data, the string select line SSL is selected in response to a voltage (e.g., a ground voltage GND) and the common source line CSL have a voltage greater than the ground voltage, for example, a supply voltage VCC around 2 Volts. Based on the data pattern in the program buffer 280 the selected bit line BL1 has a program voltage value and the unselected bit lines BL2-BL5 have an inhibit voltage value, in which for example the program voltage value equals to the ground voltage GND and the inhibit voltage value equals a relatively high voltage, e.g., the supply voltage VCC. In sequence of programming memory cells 311, marked with "P" and coupled to the word lines WL0-WL2, a corresponding one in the word lines WL0-WL2 receives a word line signal having a voltage Vpgm and remaining word lines receive a voltage Vihn smaller than Vpgm. For example, when the memory cell 311 coupled to the word line WL0 is to be programmed, the word line signal in the word line WL0 has the voltage Vpgm while the word line signals in the word lines WL1-WL95 have the voltage Vihn. In some embodiments, the voltage Vpgm is around 20 to 25 Volts and the voltage Vihn is around 10 Volts.

The configurations of programming memory cells 311 in the strings S2-S5 are similar to that of for the string S1, and hence, the repetitious descriptions are omitted herein.

In the embodiments of FIG. 3, the memory cells 311 marked with "P" are referred to as programmed cells. As shown in FIG. 3, numbers of programmed cells in the memory cells 311 in the strings S1-S5 are different. For example, a number, equal to 3, of programmed cells in the memory cells 311 in the string S1 is different from a number, equal to 4, of programmed cells in the memory cells 311 in the string S2. Specifically, numbers of programmed cells in the strings S1-S5 are 3, 4, 6, 7, 8 separately.

In operation 402, a read operation is performed to multiple reference cells RC in the memory cells that are selected to obtain multiple read currents IBL1-IBL5 in the bit lines BL1-BL5. As illustratively shown in FIG. 3, each of the reference cells RC is coupled to a corresponding string of the strings S1-S5 through a corresponding one in the bit lines BL1-BL5. In some embodiments, the reference cells RC are erased and have a relatively low threshold voltage compared with the threshold voltage of the programmed cells.

For example, in the embodiments of obtaining the read current IBL1, the string select line SSL and the global select line GSL are selected in response to the supply voltage VCC, and the common source line is grounded. The reference cells RC in one of the pages 31 coupled to the word line 91 are selected in response to a read voltage Vread of a word line signal in the word line WL91. The word line signals in remaining word lines WL1-WL94 and DWLT, DWLB have a read pass voltage VpassR, and the word line signal for the compensation cells 321 through the word line WL95 has a voltage Vpass_I. In some embodiments, the voltage Vpass_I is smaller than around 0.5 Volts for the compensation cells which have a relatively low threshold voltage(<0.5V) and the read pass voltage VpassR which is around 7 Volts. Furthermore, the bit line BL1 is selected in response to an applied voltage Vr while remaining unselected bit lines BL2-BL5 have the ground voltage GND.

The configurations of obtaining the read current IBL2-IBL5 in the read operation are similar to that of for the read current IB1, and hence, the repetitious descriptions are omitted herein.

Figure 5:
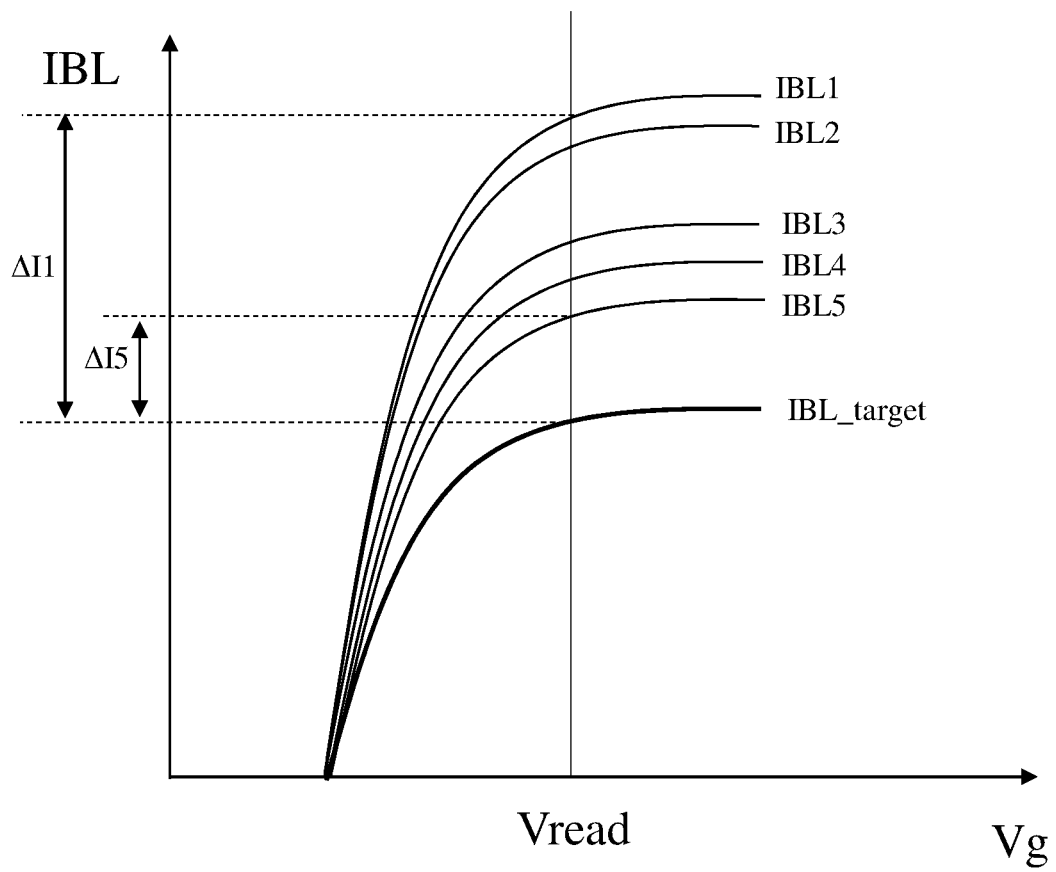
FIG. 5 depicts a schematic diagram of read currents verse a voltage applied on reference cells, in accordance with some embodiments.

With reference to FIG. 5, the read current IBL1-IBL5 are depicted with respect to the voltage applied on the word line WL91 coupled to the reference cells RC. In some embodiments, a variation in the number of programmed cells in the strings induces variety in the read currents in the strings due to different string resistance, retention, temperature, or/and other factors of operation, which is referred as a pattern effect of read currents. Specifically, the resistance of a string in FIG. 3 can be given as the equation (1) below:

$$R\_string = R\_select + R\_unselect + R\_com \quad (1)$$

R_string corresponds to a resistance of a string, for example, one of the strings S1-S5. R_select corresponds to a resistance of the selected memory cell, for example, one of the reference cells RC. R_unselect corresponds to a resistance of unselect memory cells, for example, remaining memory cells 311, in the string. R_com corresponds to a resistance of the compensation cell 321 in the string.

In some embodiments, the resistance R_unselect is associated with a number of programmed cells in the string. When the number of programmed cells in the string increases, the resistance R_unselect increases and the read current passing through decreases correspondingly. On the contrary, the resistance R_unselect decreases as the number of programmed cells in the string decreases and the read current passing through increases correspondingly.

As illustratively shown in FIG. 5, by performing the read operation to the reference cells RC, current values of the obtained read currents IBL1-IBL5 are inversely proportional to the numbers of the programmed cells in the memory cells 311 in the strings S1-S5. For example, a number, equal to 3, of programmed cells in the string S1 corresponding to the largest read current IB1 is smaller than a number, equal to 8, of programmed cells in the string S5 corresponding to the smallest read current IB5.

In some approaches, since each of the reference cells RC in the strings S1-S5 are all erased and have a same resistance state, the read currents IBL1-IBL5 should be the same, equal to a target current IBL_target, and have a same current value in response to the same read voltage Vread. The resistance R_string is the same for all strings S1-S5. However, the undesired variation in the read currents emerges due to various resistance R_string, as shown in FIG. 5. In some arrangements, the read currents indicate computing-in-memory results based on the stored weight values in the memory array, and accordingly, the pattern effect inducing the variation of read currents deteriorates the accuracy of the neural network 106 in FIG. 1, and needs to be addressed.

In operation 403, the read currents IBL1-IBL5 are compensated to a target current value, equal to the target current IBL_target, by adjusting a voltage difference between at least one compensation voltage Vpass_com applied on the compensation cells 321 and threshold voltages of the compensation cells 321 in the read operation. In some embodiments, voltage difference between at least one compensation voltage Vpass_com applied on the compensation cells 321 and threshold voltages of the compensation cells 321 determines the resistance R_com in equation (1). Alternatively stated, through adjusting the aforementioned voltage difference based on the number of programmed cells in the string, the compensation cell 321 has the resistance R_com associated with the number of programmed cells in the string. The resistance R_string is modified based on the resistance R_com, and accordingly, the difference in the read currents is eliminated. In some embodiments, the control circuitry 210 of FIG. 2 is configured to adjust the compensation voltage Vpass_com by controlling the word line decoder 250. In various embodiments, the control circuitry 210 is configured to control the program buffer 280, the row decoder 240, and the word line decoder 250 to program the compensation cells 321 in order to alter the threshold voltages of the compensation cells.

Figure 6:
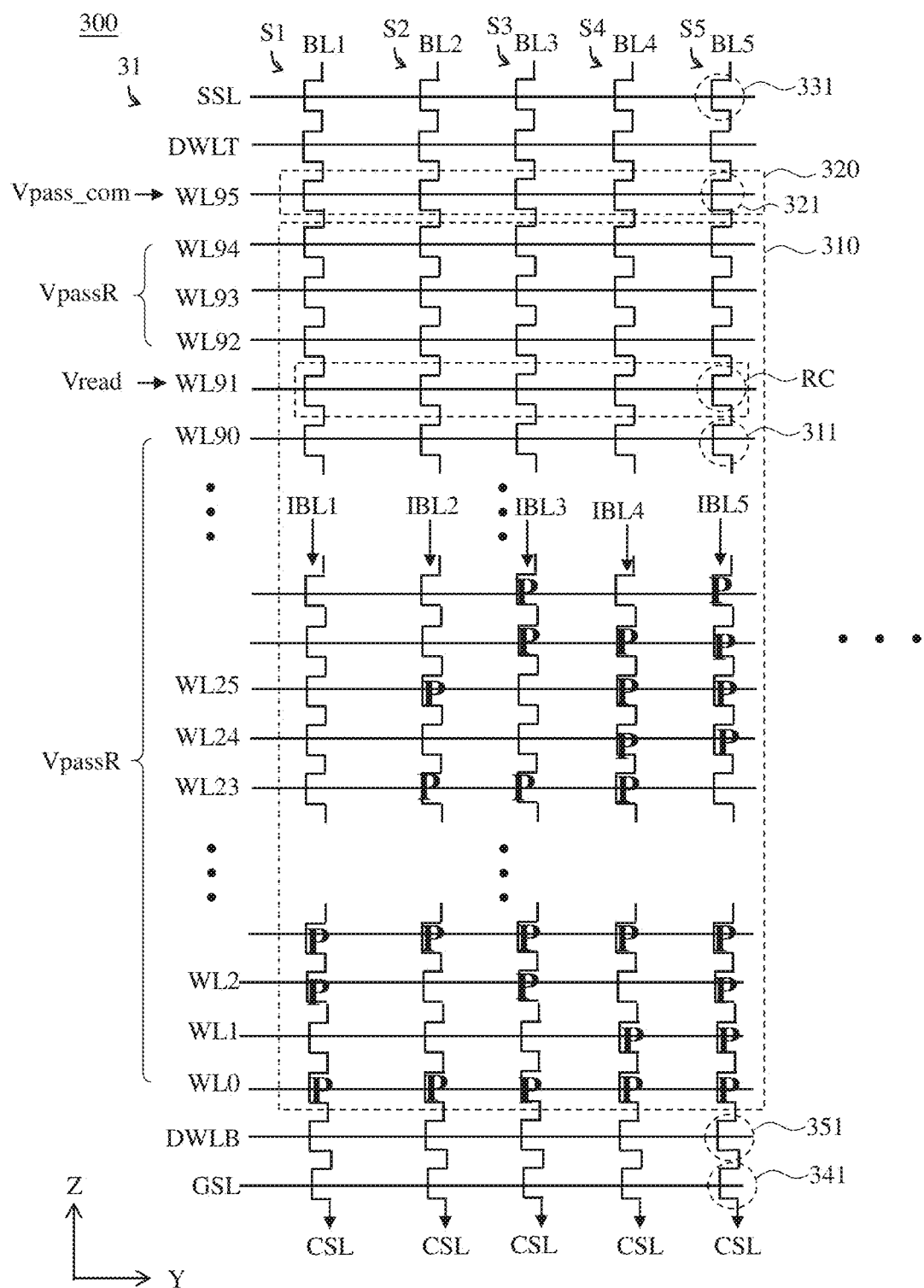
FIG. 6 illustrates a schematic diagram of part of the memory array in FIG. 3, in accordance with some embodiments.

Based on the discussions above, as shown in FIGS. 5-6, because difference between the target read current IBL_target and the read currents IBL1-IBL5 vary, the resistances R_com of the compensation cells 321 in different strings are different.

An embodiment of adjusting the voltage difference between at least one compensation voltage Vpass_com and the threshold voltages of the compensation cells 321 is by adjusting the compensation voltage Vpass_com based on the number of programmed cells in the string and keeping the threshold voltages of the compensation cells. In some embodiments, the voltage difference between at least one compensation voltage Vpass_com and the threshold voltages is less than about 1 Volt.

For example, in the embodiments of FIGS. 5-6, the read current IBL1 differs from the target current value of the target read current IBL_target by a value ΔI1 as the string S1 has three programmed cells. In the read operation, the string select line SSL and the global select line GSL are selected in response to the supply voltage VCC, the common source line CSL is grounded, the word line 91 are selected in response to the read voltage Vread, and the word line signals in remaining word lines WL1-WL94 and DWLT, DWLB have the read pass voltage VpassR. By applying the compensation voltage Vpass_com having a voltage value V1 to the compensation cell 321 in the string S1, the compensation cell 321 has a resistance R1 responsive to the compensation voltage Vpass_com to adjust the read current IBL1 to the target read current IBL_target in the read operation.

Sequentially, the read current IBL5 differs from the target current value of the target read current IBL_target by a value ΔI5 as the string S5 has eight programmed cells. By applying the compensation voltage Vpass_com having a voltage value V5 to the compensation cell 321 in the string S5, the compensation cell 321 has a resistance R5 responsive to the compensation voltage Vpass_com to adjust the read current IBL5 to the target read current IBL_target in the read operation.

In some embodiments, the resistance R_com is inversely proportional to the number of the programmed cells in the memory cells 311 coupled to the corresponding bit line. For example, based on the aforementioned embodiments, as the number of programmed cells in the string S5 is greater than that in the string S1, the resistance R5 is smaller than the resistance R1.

Furthermore, the compensation voltage Vpass_com is proportional to the number of the programmed cells in the memory cells 311 in the string. Accordingly, the voltage value V1 is smaller than the voltage value V5. In some embodiments, the compensation voltage Vpass_com is smaller than the read pass voltage VpassR. In some embodiments, the compensation voltage Vpass_com is less than about 30% of the read pass voltage VpassR.

Figure 7:
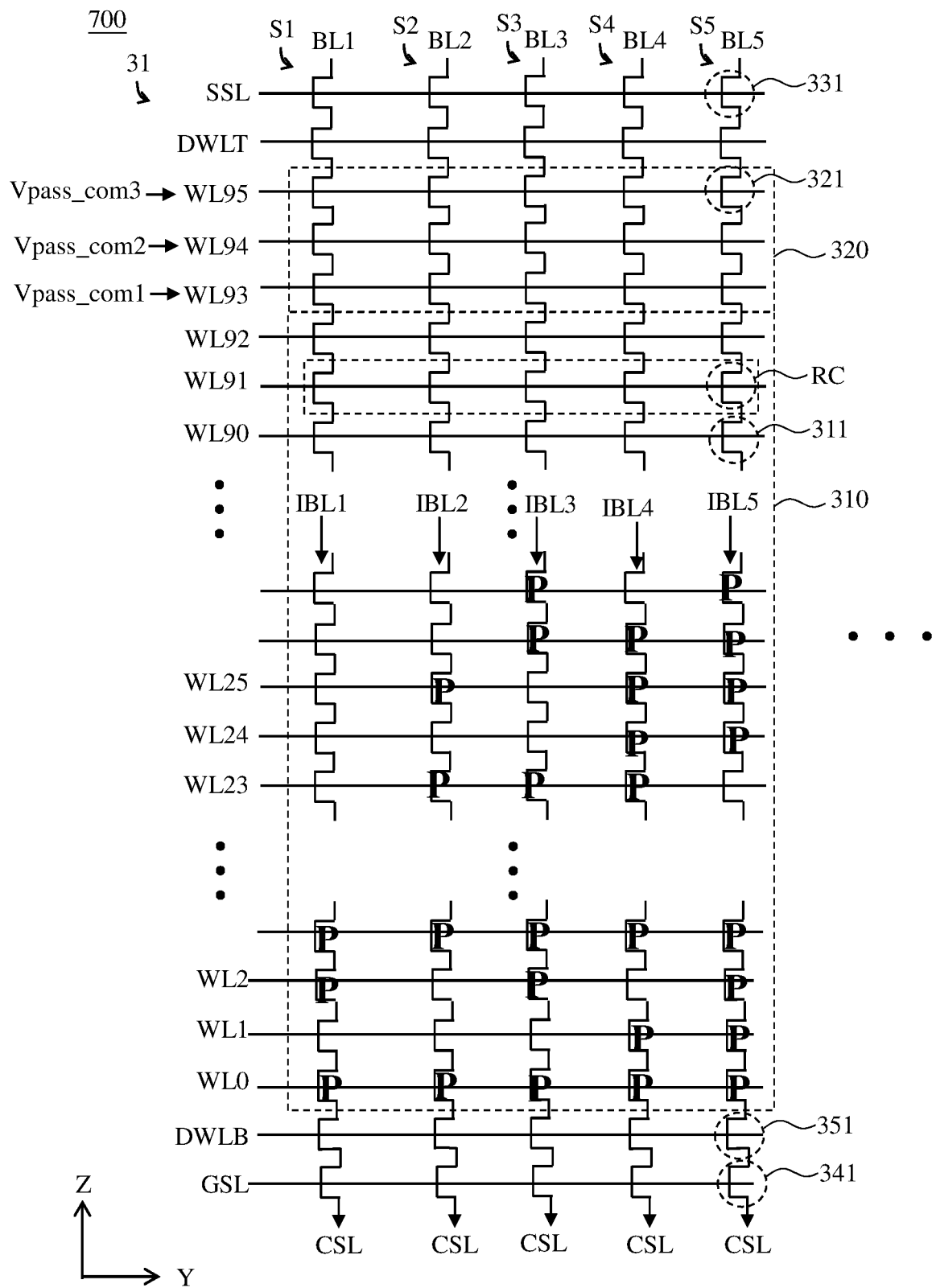
FIG. 7 illustrates a schematic diagram of part of a memory array corresponding to memory arrays in FIGS. 2-3 and 6, in accordance with some embodiments.

Reference is now made to FIG. 7. FIG. 7 illustrates a schematic diagram of part of a memory array 700 corresponding to the memory arrays 260 and 300 in FIGS. 2-3 and 6, in accordance with some embodiments.

Compared with FIG. 3, instead of having one compensation cell 321 in each string of the memory array 300, the memory array 700 includes more than one, for example, three compensation cells 321 that are coupled to a corresponding bit line in a corresponding string, as shown in FIG. 7.

In some embodiments, the multiple compensation cells 321 in the strings S1-S5 are configured to transmit, in response to the word line signals in the word lines, the read currents IBL1-IBL5 that have a same current value. Specifically, for compensating the read current, for example, one of the read currents IBL1-IBL5, to the current value of the target read current IBL_target, multiple compensation voltages Vpass_com1 to Vpass_com3 are applied to the compensation cells 321 through the word lines WL93-WL95 separately, and accordingly, an effective resistance R_com of series coupled compensation cells 321 in the same string adjusts the resistance R_string of the string, in which the compensation voltages Vpass_com1 to Vpass_com3 are associated with the number of programmed cells in the string as discussed in the paragraphs above. Consequently, one of the read currents IBL1-IBL5 is compensated to have the same current value of the target read current IBL_target. The configurations of compensating other read current in the memory array 700 are similar to the above, and hence, the repetitious descriptions are omitted herein.

In some embodiments, voltage values of the word line signals having the compensation voltages Vpass_com1 to Vpass_com3 in the word lines WL93-95 are smaller than voltage values of the word line signals having the read pass voltage VpassR transmitted to unselected memory cells in the memory cells 311.

Another embodiment of adjusting the voltage difference between at least one compensation voltage Vpass_com and the threshold voltages Vt_com of the compensation cells 321 is by adjusting the threshold voltages Vt_com of the compensation cells according to the number of programmed cells in the string and keeping the compensation voltage Vpass_com. In some embodiments, the voltage difference between at least one compensation voltage Vpass_com and the threshold voltages Vt_com is less than about 1 Volt.

Figure 8:
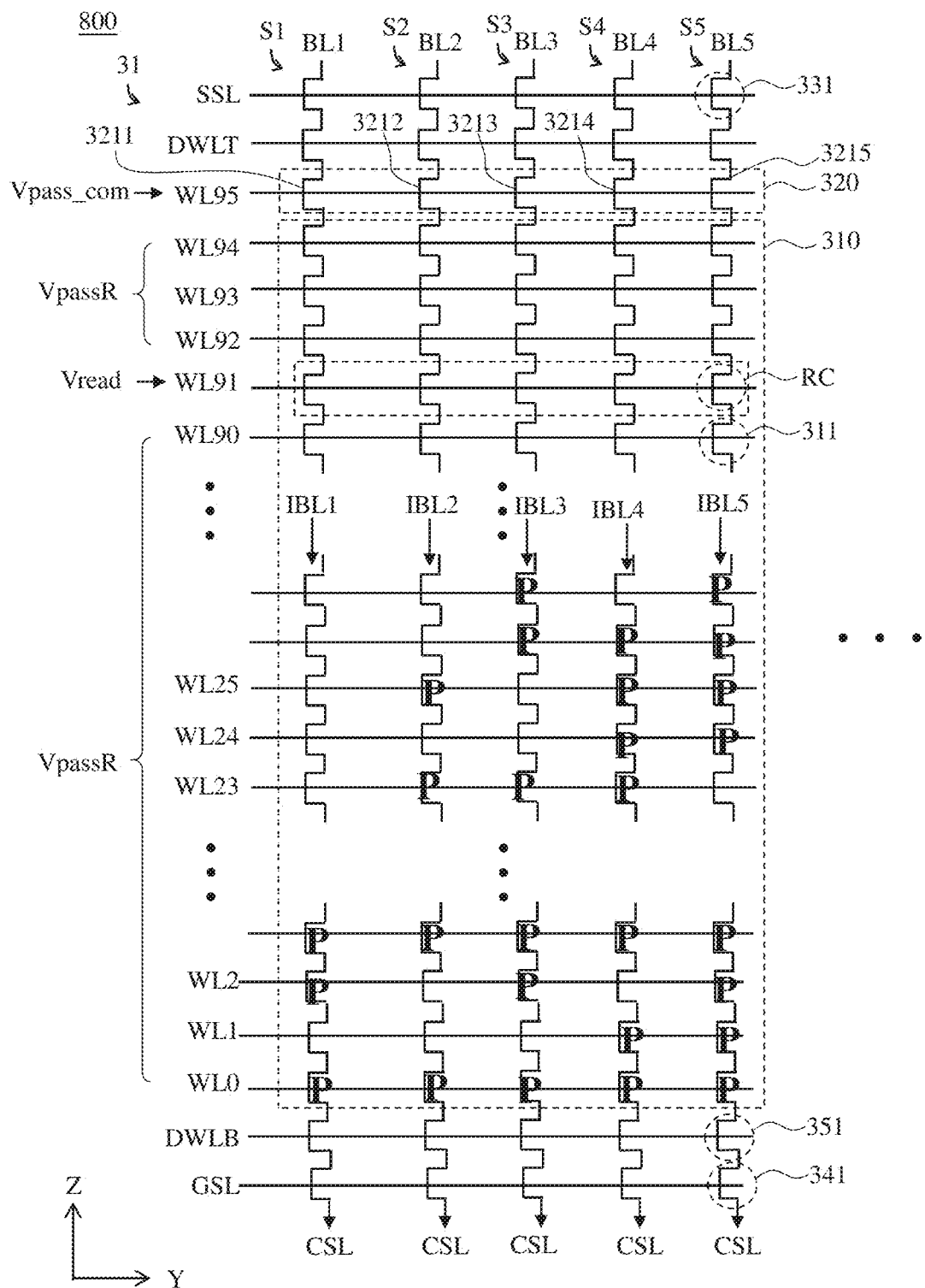
FIG. 8 illustrates a schematic diagram of part of a memory array corresponding to memory arrays in FIGS. 2-3, in accordance with some embodiments.

With reference to FIGS. 4-5 and 8, the operation of compensating the read currents in the operation method 400 includes operations of performing another programming operation to adjust the threshold voltages of the compensation cells 3211-3215 in the strings S1-S5 according to a number of programmed cells in the memory cells 311 of the strings S1-S5. In some embodiments, the compensation cells 3211-3215 are configured with respect to the compensation cell 321 in FIG. 3. In some embodiments, the compensation cells 3211-3215 include charge trapping structures. The compensation cells are programmed by applying a bias between the gate and the channel to trap charges, and the threshold voltage of the compensation cell is adjusted to the desired value.

In some embodiments, due to different numbers of programmed cells in the strings S1-S5, the threshold voltage of the compensation cells 3211-3215 in the same page are different from each other. For example, the compensation cell 3211, coupled to the smallest amount of programmed cells in the string S1, is programmed to have a largest threshold value, and the compensation cell 3215, coupled to the largest amount of programmed cells in the string S5, is programmed to have a smallest threshold value.

In some embodiments, the compensation voltage Vpass_com applied to the compensation cells 3211-3215 for reading out the read currents IBL1-IBL5 has a same value and ranges between slightly greater than the smallest threshold voltages of the compensation cells 3211-3215 and the read pass voltage VpassR. In various embodiments, the compensation voltage Vpass_com is smaller than around 30% of the read pass voltage VpassR.

Figure 9:
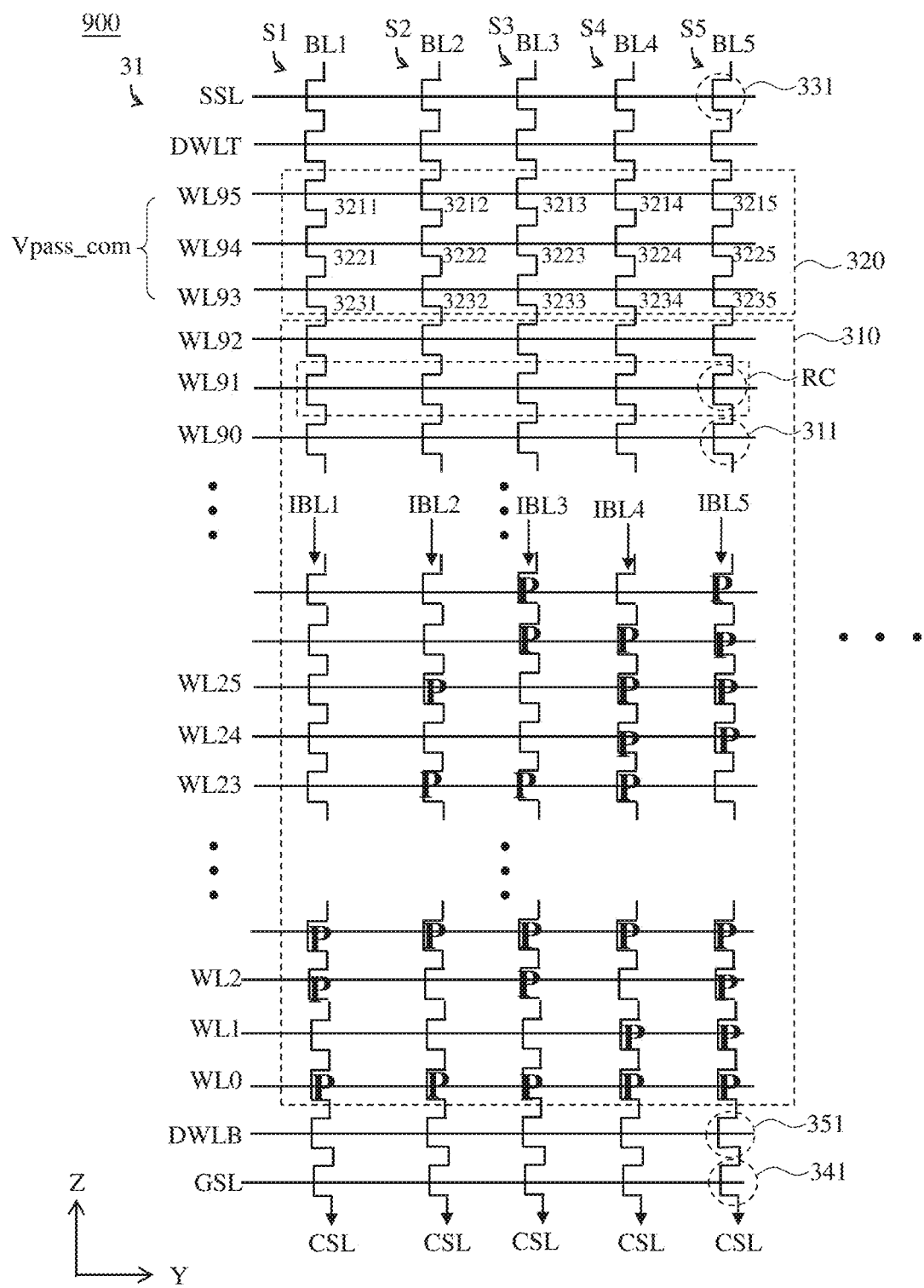
FIG. 9 illustrates a schematic diagram of part of a memory array corresponding to memory arrays in FIGS. 2-3 and 8, in accordance with some embodiments.

Reference is now made to FIG. 9. FIG. 9 illustrates a schematic diagram of part of a memory array 900 corresponding to the memory arrays 260, 300, and 800 in FIGS. 2-3 and 8, in accordance with some embodiments.

Compared with FIG. 8, instead of having one of the compensation cells 3211-3215 in each string of the memory array 800, the memory array 900 of FIG. 9 includes more than one, for example, three pages 31 of compensation cells 3211-3215, 3221-3225, and 3231-3235 in the sub-array 320, in which the compensation cells 3211, 3221, and 3231 are coupled to the bit line BL1, and so on.

In some embodiments, as discussed with FIG. 8, the compensation cells 3211-3215 are programmed to have different threshold voltage. The threshold voltages of the compensation cells 3221-3225 and 3231-3235 are the same. Accordingly, the threshold voltages of the compensation cells in the same string are different. The effective resistance R_com of series coupled compensation cells, for example, the compensation cells 3211, 3221, and 3231 in the same string S1 adjusts the resistance R_string of the string and transmit, in response to the same compensation voltage Vpass_com in the word lines WL93-95, the read current IBL1 having a current value of the target read current IBL_target in the read operation.

In various embodiments, compensation cells in more than one page are programmed to have proper threshold voltages to transmit the read current having a current value of the target read current IBL_target in the read operation.

Figure 10:
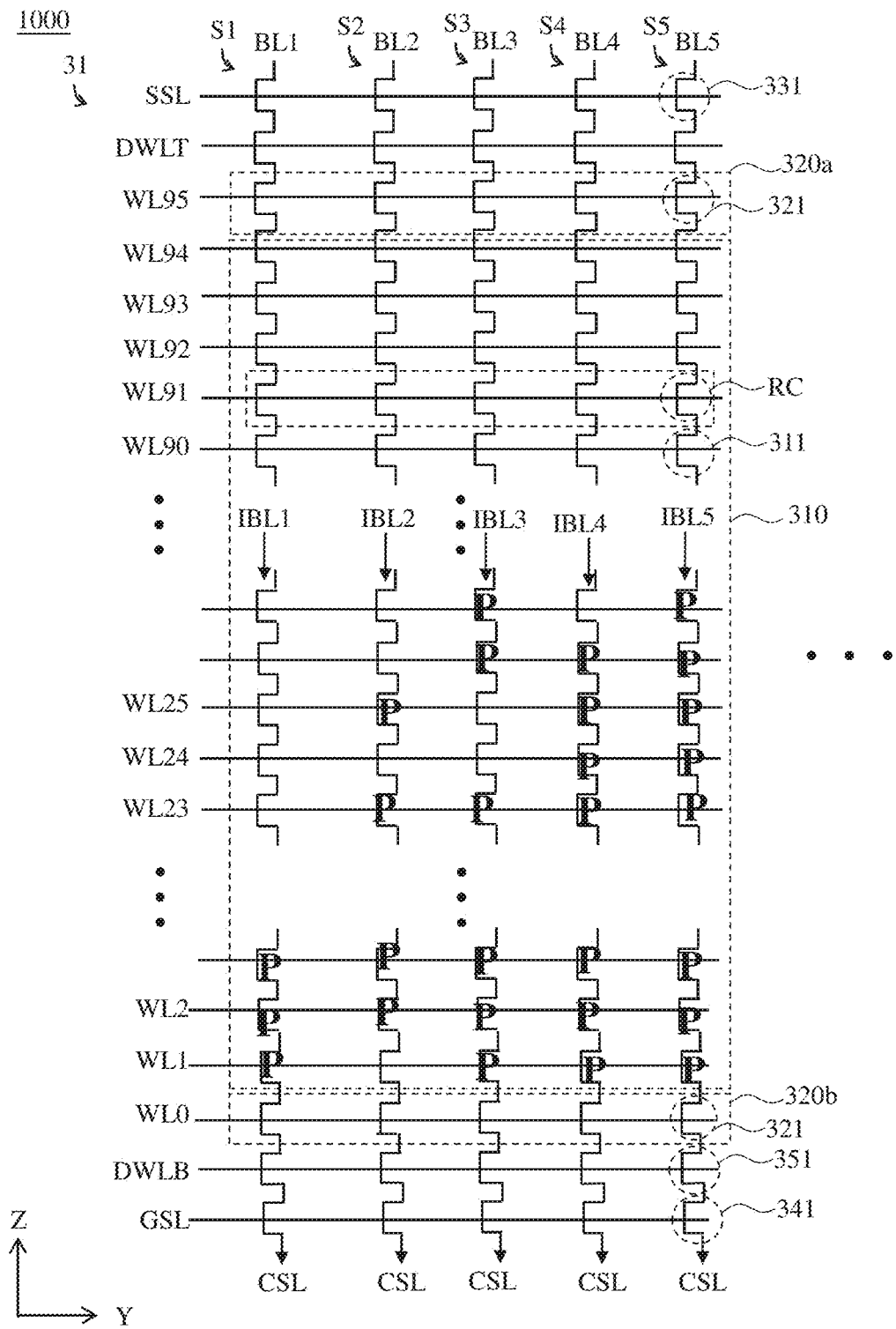
FIG. 10 illustrates a schematic diagram of part of a memory array corresponding to a memory array in FIGS. 2-3, in accordance with some embodiments.

Reference is now made to FIG. 10. FIG. 10 illustrates a schematic diagram of part of a memory array 1000 corresponding to a memory array in FIGS. 2-3, in accordance with some embodiments.

Compared with FIG. 3, portions 320a-320b of the sub-array 320 are separated by the sub-array 310. Alternatively stated, the compensation cells 321 are separated by the memory cells 311.

The configurations of FIGS. 3-10 are given for illustrative purposes. Various implements are within the contemplated scope of the present disclosure. For example, in some embodiments, more pages of compensation cells 321 and more pages of the memory cells 311 are included in the memory array.

Based on the above disclosure, a memory device and operation method are provided. By adding compensation cells to a memory array and adjusting the difference between the voltage applied to the compensation cells and threshold voltages thereof according to the number of programmed cells in each string of the memory array, the read current of the string is precisely compensated. The above configuration significantly reduces the variation of read currents and improves the accuracy of the neural network utilizing read currents. At the same time, since only a few compensation cells are required, the cost is less than that of approaches requiring many additional compensation circuits, and the required drive power is reduced, improving the performance of the memory device.

Although the present application has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present application without departing from the scope or spirit of the disclosure. In view of the foregoing, it is intended that the present application cover modifications and variations of this disclosure provided they fall within the scope of the following claims.

What is claimed is:

1. A memory device, comprising:
a memory array comprising a plurality of strings, each of the plurality of strings comprising a plurality of memory cells and at least one compensation cell that are coupled in series to a corresponding one of a plurality of bit lines,
wherein in a read operation, the at least one compensation cell in each of the plurality of strings has a resistance responsive to at least one compensation voltage applied on the at least one compensation cell to adjust a read current in the corresponding bit line to a current value, wherein the resistance is associated with a number of programmed cells in the plurality of memory cells coupled to the corresponding bit line.

2. The memory device of claim 1, wherein the resistance of the at least one compensation cell is inversely proportional to the number of the programmed cells in the plurality of memory cells coupled to the corresponding bit line.

3. The memory device of claim 1, wherein when the number of the programmed cells in a first string of the plurality of strings is greater than the number of the programmed cells in a second string of the plurality of strings, the resistance of the at least one compensation cell in the first string is smaller than the resistance of the at least one compensation cell in the second string.

4. The memory device of claim 1, wherein unselected memory cells in the plurality of memory cells receive a read pass voltage through a plurality of word lines in the read operation,
wherein the at least one compensation voltage is smaller than the read pass voltage.

5. The memory device of claim 1, wherein the at least one compensation cell includes a plurality of the compensation cells in a plurality of pages in a corresponding string.

6. The memory device of claim 5, wherein the at least one compensation voltage includes a plurality of compensation voltages each applied to a corresponding one of the plurality of the compensation cells.

7. The memory device of claim 5, wherein threshold voltages of a plurality of the compensation cells are different from each other.

8. The memory device of claim 5, wherein the plurality of compensation cells are separated by the plurality of memory cells.

9. The memory device of claim 1, wherein the at least one compensation cell in each of the plurality of strings is configured to be programmed to have a threshold voltage according to the number of the programmed cells in a corresponding string in the plurality of strings.

10. An operation method of a memory device, comprising:
performing a first programming operation to write data corresponding to a neural network to a memory array, wherein the memory array comprises a plurality of memory cells in a first sub-array and a plurality of compensation cells in a second sub-array that are arranged in a plurality of strings;
performing a first read operation to a plurality of reference cells that are selected to obtain a plurality of read currents in a plurality of bit lines, wherein each of the plurality of reference cells is coupled to a corresponding string of the plurality of strings and to a corresponding one in the plurality of bit lines; and
compensating the plurality of read currents to a target current value by adjusting a voltage difference between at least one compensation voltage applied on the plurality of compensation cells and threshold voltages of the plurality of compensation cells in a second read operation.

11. The operation method of claim 10, wherein the plurality of compensation cells are coupled to a same word line,
wherein the compensating the plurality of read currents comprises:
applying the at least one compensation voltage having a first voltage value when a first read current of the plurality of read currents differs from the target current value by a first value; and
applying the at least one compensation voltage having a second voltage value when a second read current of the plurality of read currents differs from the target current value by a second value,
wherein the first value is greater than the second value, and the first voltage value is smaller than the second voltage value.

12. The operation method of claim 11, wherein a number of programmed cells in a first string, corresponding to the first read current, of the plurality of strings is smaller less a number of programmed cells in a second string, corresponding to the second read current, of the plurality of strings.

13. The operation method of claim 10, wherein compensating the plurality of read currents comprises:
performing a second programming operation to adjust the threshold voltages of the plurality of compensation cells in the plurality of strings according to a number of programmed cells in the plurality of memory cells of the plurality of strings.

14. The operation method of claim 10, wherein the plurality of compensation cells are arranged in a plurality of pages in the second sub-array,
wherein compensating the plurality of read currents comprises:
performing a second programming operation to adjust the threshold voltages of the plurality of compensation cells in one page of the plurality of pages to be greater than the threshold voltages of the plurality of compensation cells in remaining pages of the plurality of pages.

15. The operation method of claim 10, wherein first and second portions of the second sub-array are on opposite sides of the first sub-array.

16. The operation method of claim 10, wherein the plurality of reference cells are erased.

17. A memory device, comprising:
a memory array comprising a plurality of strings including a plurality of memory cells and a plurality of compensation cells that are coupled in series to a plurality of bit lines,
wherein in a read operation, the plurality of compensation cells in the plurality of strings are configured to transmit, in response to a plurality of first word line signals, a plurality of read currents that have a same current value,
wherein a number of programmed cells in the plurality of memory cells in a first string of the plurality of strings is different from a number of programmed cells in the plurality of memory cells in a second string of the plurality of strings,
wherein voltage values of the plurality of first word line signals are different from each other and smaller than voltage values of a plurality of second word line signals transmitted to unselected memory cells in the plurality of memory cells.

18. The memory device of claim 17, wherein resistances of the plurality of compensation cells in different strings of the plurality of strings are different.

19. The memory device of claim 17, wherein threshold voltages of the plurality of compensation cells are different from each other.

* * * * *